United States Patent
Pio

(10) Patent No.: US 6,548,355 B2
(45) Date of Patent: Apr. 15, 2003

(54) EEPROM MEMORY CELL AND CORRESPONDING MANUFACTURING METHOD

(75) Inventor: Federico Pio, Brugherio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/760,069

(22) Filed: Jan. 11, 2001

(65) Prior Publication Data

US 2001/0001294 A1 May 17, 2001

Related U.S. Application Data

(62) Division of application No. 09/343,120, filed on Jun. 29, 1999, now Pat. No. 6,207,990.

(30) Foreign Application Priority Data

Jun. 30, 1998 (EP) .............................. 98830390

(51) Int. Cl.[7] .............................. H01L 21/336
(52) U.S. Cl. .................. 438/264; 438/266; 438/286
(58) Field of Search ................... 438/201, 262, 438/263, 264, 266, 260, 286

(56) References Cited

U.S. PATENT DOCUMENTS

| | | | | |
|---|---|---|---|---|
| 4,701,776 A | * | 10/1987 | Perlegos et al. | 257/321 |
| 4,814,854 A | | 3/1989 | Tigelaar et al. | 357/67 |
| 4,833,096 A | * | 5/1989 | Huang et al. | 438/201 |
| 4,851,361 A | * | 7/1989 | Schumann et al. | 257/321 |
| 5,017,979 A | * | 5/1991 | Fujii et al. | 257/319 |
| 5,326,999 A | | 7/1994 | Kim et al. | 275/315 |
| 5,440,158 A | | 8/1995 | Sung-Mu | 257/314 |
| 5,471,422 A | | 11/1995 | Chang et al. | 365/185.26 |
| 5,550,072 A | * | 8/1996 | Cacharelis et al. | 438/201 |
| 5,606,521 A | | 2/1997 | Kuo et al. | 365/149 |
| 5,619,052 A | | 4/1997 | Chang et al. | 257/321 |
| 5,874,759 A | | 2/1999 | Park | 257/314 |
| 5,912,487 A | | 6/1999 | Hong | 257/315 |
| 5,925,906 A | | 7/1999 | Tanaka | 257/314 |
| 5,929,479 A | | 7/1999 | Oyama | 257/315 |
| 5,936,274 A | | 8/1999 | Forbes et al. | 257/315 |
| 5,937,298 A | * | 8/1999 | Hung et al. | 438/286 |
| 5,998,826 A | | 12/1999 | Hung et al. | 257/315 |
| 6,018,178 A | | 1/2000 | Sung | 257/316 |

FOREIGN PATENT DOCUMENTS

| | | | | |
|---|---|---|---|---|
| EP | 0 366 423 B1 | | 5/1994 | |
| EP | 0 655 785 A2 | | 5/1995 | |
| EP | 0 752 721 A2 | | 1/1997 | |
| JP | 2-1176 | | 1/1990 | |
| JP | 5-67791 | | 3/1993 | |
| JP | 5-121755 | | 5/1993 | |
| JP | 5-121756 | | 5/1993 | |
| JP | 05129620 A | * | 5/1993 | ......... H01L/29/788 |
| JP | 5-129614 | | 5/1996 | |
| JP | 08293564 A | * | 11/1996 | ....... H01L/21/8247 |
| JP | 09106700 A | * | 4/1997 | ........... G11C/29/00 |

* cited by examiner

*Primary Examiner*—Sheila V. Clark
*Assistant Examiner*—Paul E Brock, II
(74) *Attorney, Agent, or Firm*—Lisa K. Jorgenson; Robert Iannucci; Seed IP Law Group PLLC

(57) ABSTRACT

An EEPROM memory cell integrated in a semiconductor substrate comprises a floating gate MOS transistor having a source region, a drain region, and a gate region projecting from the substrate and is isolated from the substrate by an oxide layer including a thinner tunnel portion and heavily doped regions formed under said tunnel portion and extending to beneath the drain region, and a selection transistor having a source region, a drain region and a gate region, wherein said source region is heavily doped and formed simultaneously with said heavily doped regions.

13 Claims, 9 Drawing Sheets

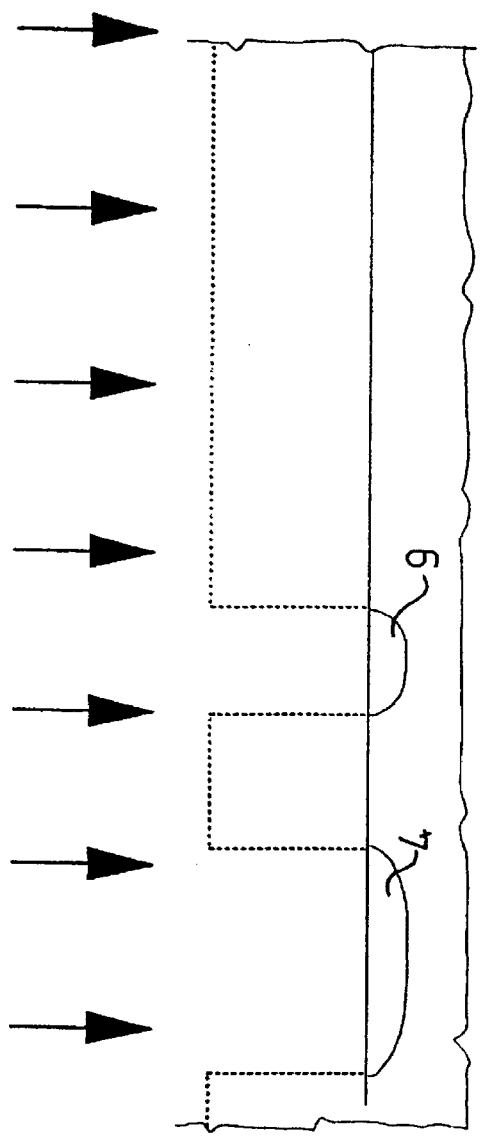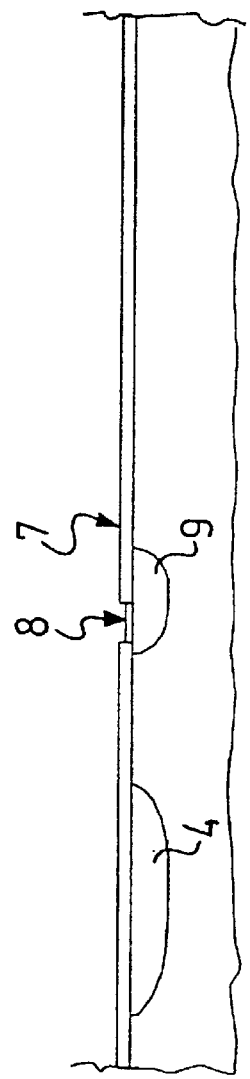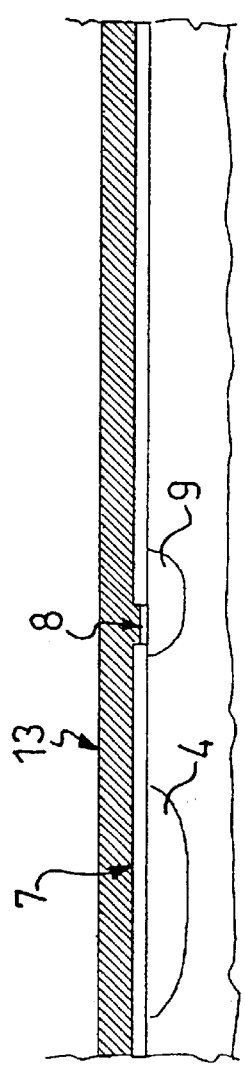
FIG. 3
FIG. 4
FIG. 5

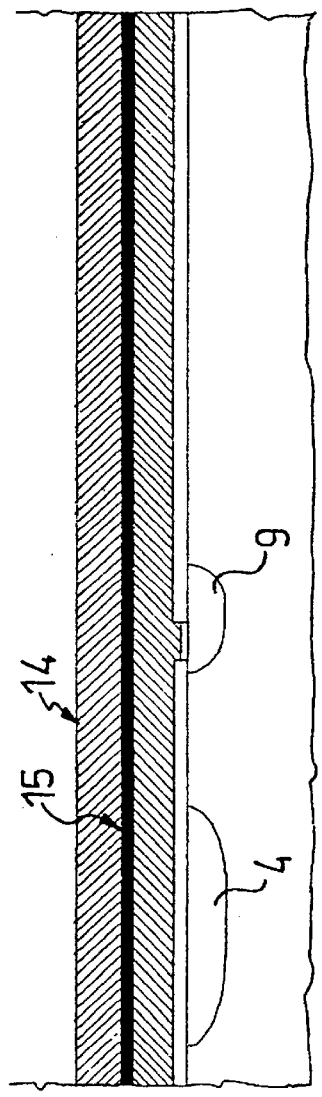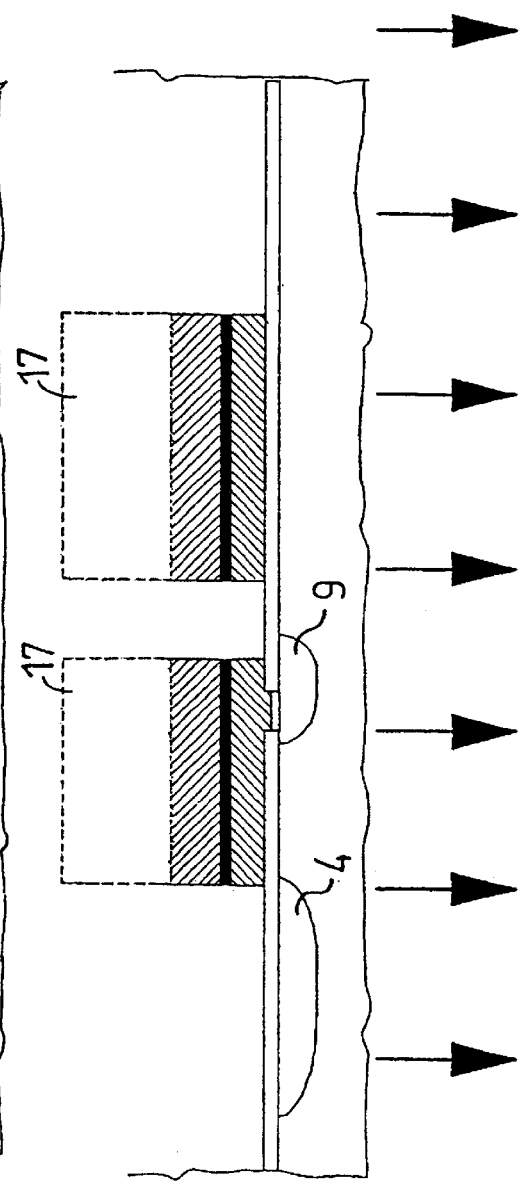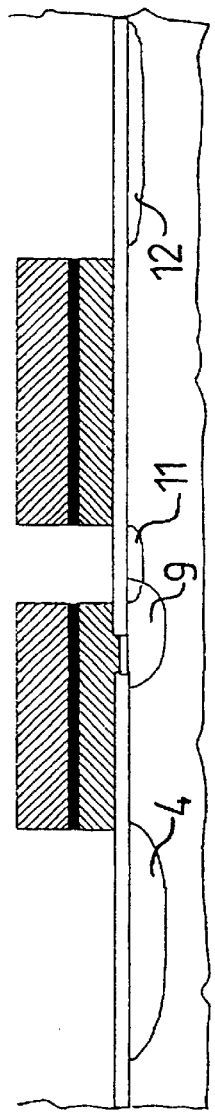

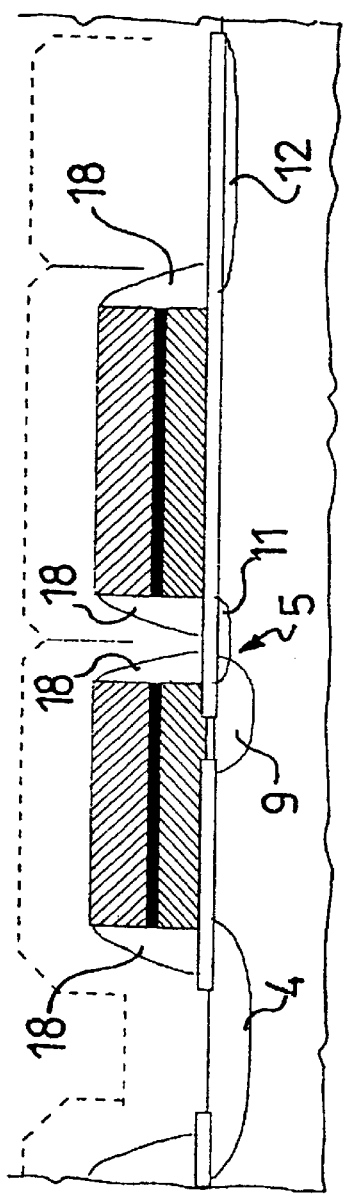
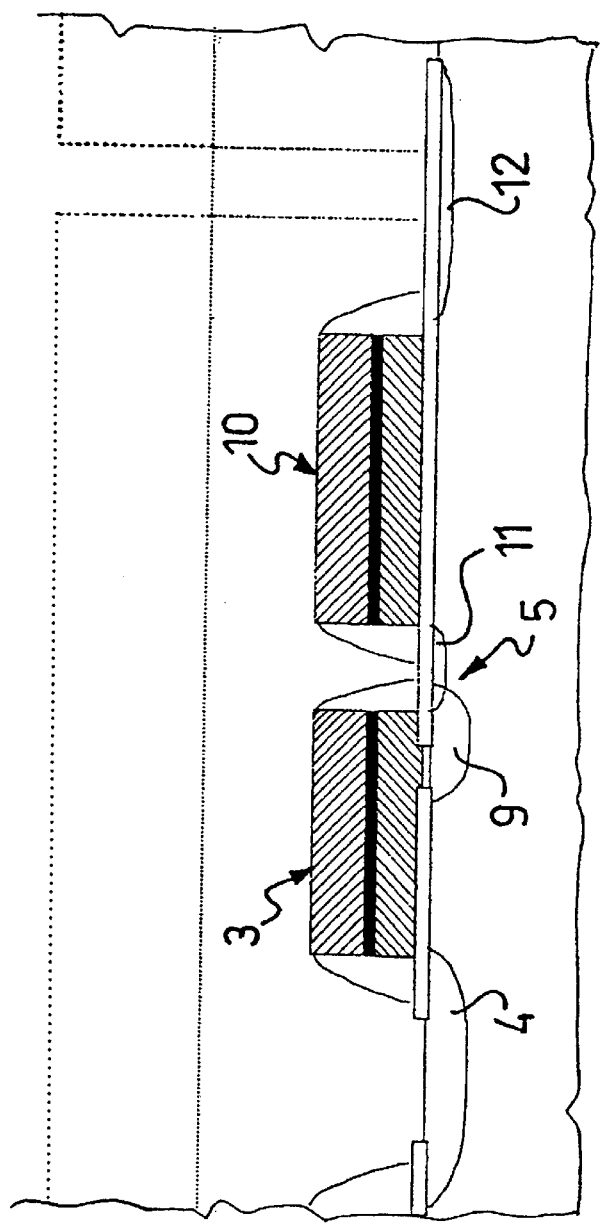

EEPROM MEMORY CELL AND CORRESPONDING MANUFACTURING METHOD

CROSS-REFERENCE TO RELATED APPLICATION

This application is a divisional of allowed U.S. patent application Ser. No. 09/343,120, filed Jun. 29, 1999 now U.S. Pat. No. 6,207,990.

TECHNICAL FIELD

This invention relates to an EEPROM memory cell and a corresponding manufacturing method.

The invention is particularly, but not exclusively, directed to providing an EEPROM cell of the FLOTOX type, and the description herein will make reference to this field of application for convenience of explanation.

BACKGROUND OF THE INVENTION

As is well known, a matrix of non-volatile memory cells comprises an array of memory cells arranged in rows and columns, each cell comprising a floating gate MOS transistor and a selection transistor.

Each MOS transistor comprises a drain region and a source region which are integrated in a semiconductor substrate and separated by a substrate portion known as the channel region. A floating gate region is formed above the substrate and separated therefrom by a thin layer of gate oxide. This gate oxide layer has a thinner portion known as the tunnel oxide.

A control gate region is coupled capacitively to the floating gate region through an intermediate dielectric layer known as the interpoly.

A heavily doped region is formed under the tunnel oxide and extends to beneath the drain region. Accordingly, the effective channel region will extend between the source region and this heavily doped region.

A problem with circuits including matrices of EEPROM cells wherein adjacent floating gate transistors have a common source region is that they have effective channel regions of a different length for each adjacent cell. This is due to misalignment of the various masks used at different steps of the process for forming source and drain regions and the heavily doped regions underlying the tunnel oxides.

Another problem encountered in the fabrication of electronic circuits with fast logic transistors and EEPROM matrices integrated in the same die comes from the presence of layers of composite materials, comprising silicon and a transition metal such as titanium or tungsten, known as sillicides. These silicide layers are used to provide layers of relatively low resistivity for significantly reducing the resistance of the interconnects and the contacts of individual devices, so that their speed of operation can be improved.

These silicide layers cannot, however, be utilised to fabricate devices wherein the source and drain regions are formed by an LDD implantation technique. For such devices, in fact, the source and drain regions are formed from lightly doped regions.

In detail, the formation of a silicide layer over the active areas of MOS transistors formed with the LDD implantation technique comprises, subsequently to forming the transistor gate, the following steps:

implanting first portions of the source and drain regions at a low dopant concentration;

forming spacers adjacent to the gate and the interconnection lines;

implanting, at a high concentration, second portions contained within the source and drain regions of the transistor;

depositing a transition metal onto the entire surface of the substrate;

applying a thermal process whereby the transition metal is caused to react selectively with the substrate surface to yield silicide in the areas uncovered by dielectric.

The process for forming silicide layers may develop problems in the lightly doped regions due both to the low dopant concentration and small thickness of the latter. For example, in the course of the thermal process for reacting the transition metal layer with the substrate surface, and silicidising the source region of EEPROM cells, a surface layer of the substrate is expended and some of the substrate dopant is taken up in the silicide layer. Consequently, in normal operation of the EEPROM cell, the silicide layer will be shorted to the substrate.

SUMMARY OF THE INVENTION

An embodiment of this invention provides an EEPROM memory cell having a length of the channel region which is unaffected by misalignments of the implants performed in forming the EEPROM memory cell.

Another embodiment of this invention provides an electronic circuit that integrates, in the same die, transistors with silicide layers, and a memory cell matrix which exhibits none of the problems accompanying the formation of the silicide layers.

The EEPROM memory cell includes a floating gate MOS transistor having a source region, a drain region, and a gate region projecting from the substrate and is isolated from the substrate by an oxide layer including a thinner portion, known as tunnel oxide. The memory cell also includes heavily doped regions formed under said tunnel portion and extending to beneath the drain region and the source region is heavily doped and formed simultaneously with said heavily doped regions under the tunnel oxide.

In addition, an embodiment of the invention is directed to a manufacturing method of such an EEPROM memory cell.

The features and advantages of the invention will be apparent from the following description of an embodiment thereof, given by way of non-limitative example with reference to the accompanying drawings.

BRIEF DESCRIPTION OF THE DRAWINGS

FIGS. 3 to 10 illustrate manufacturing process steps to the formation of the structure of FIG. 2.

DETAILED DESCRIPTION

Figure 1:
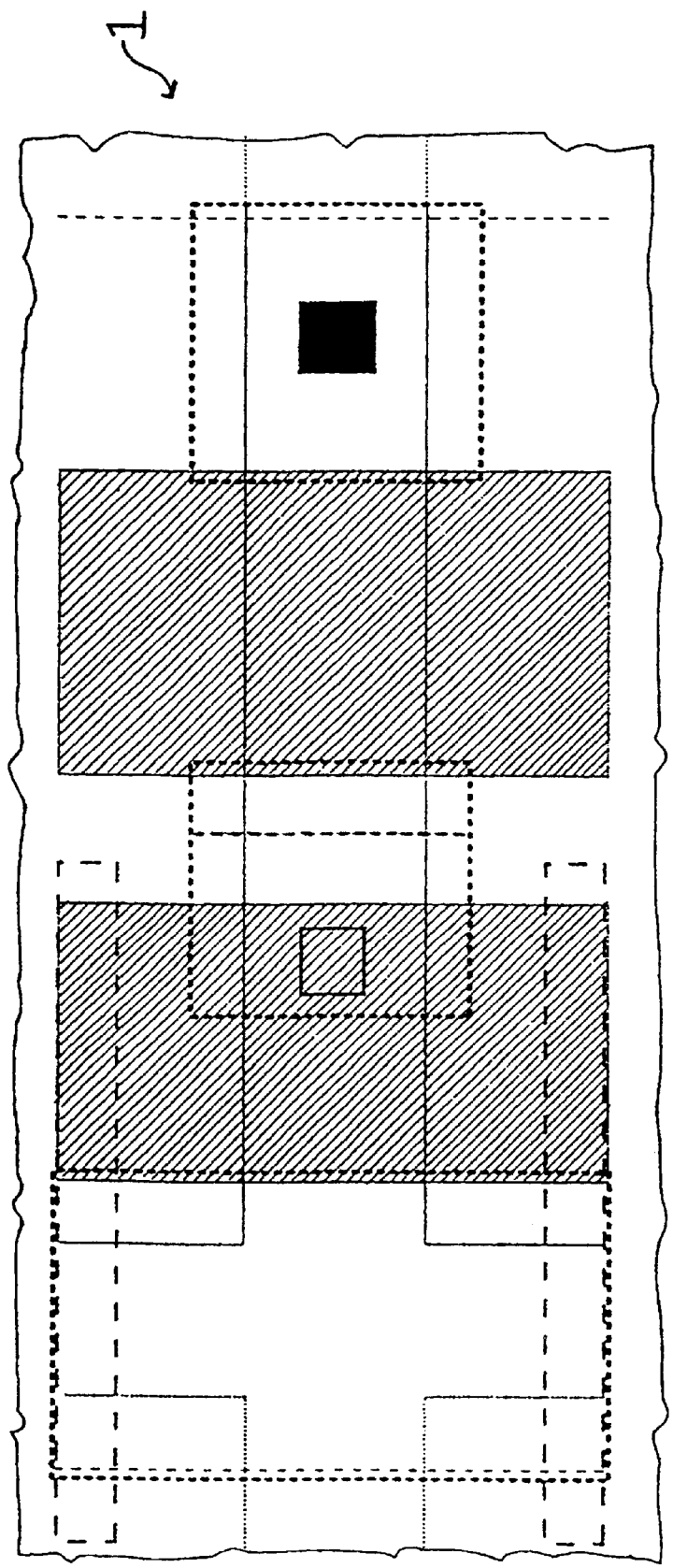
FIG. 1 is a plan view of an EEPROM cell according to a first embodiment of this invention.
Figure 2:
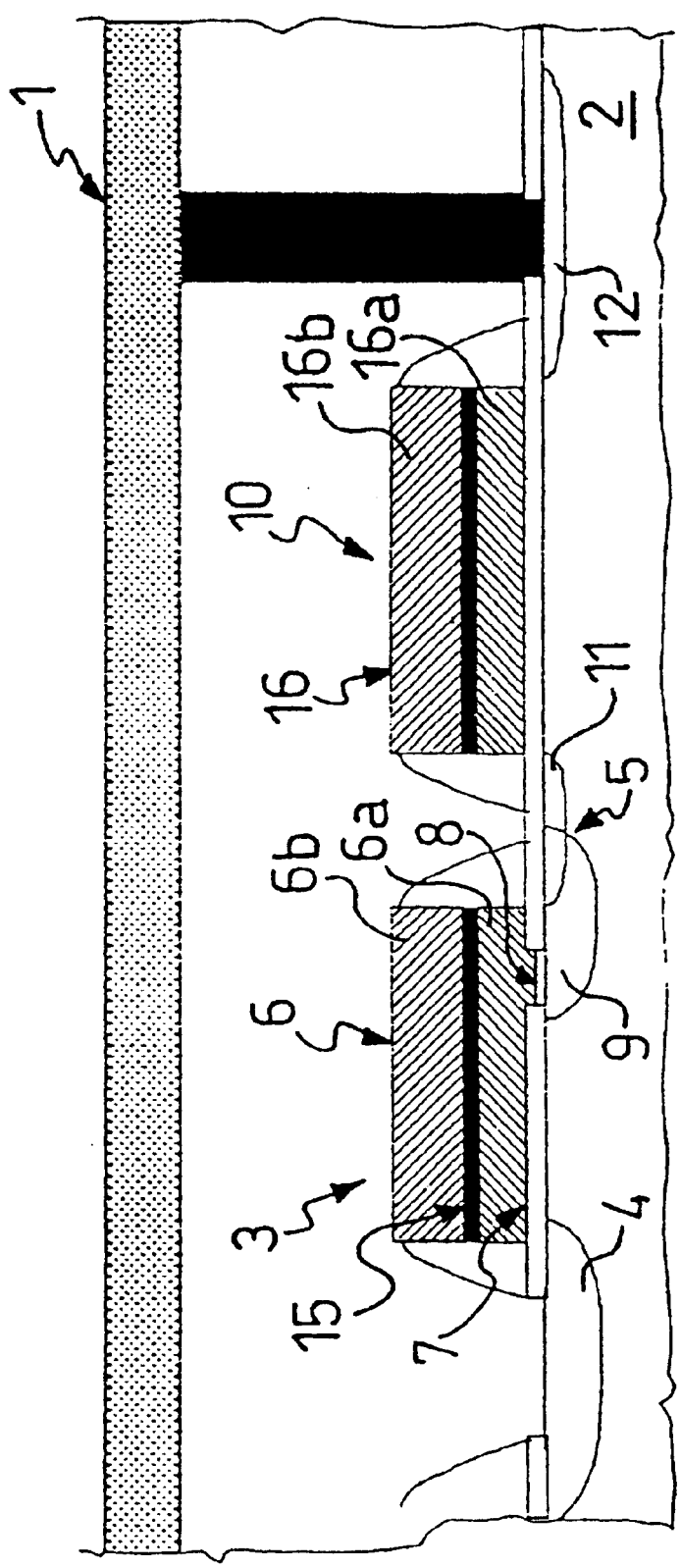
FIG. 2 is a sectional view, taken along line II—II, of the cell shown in FIG. 1.

Shown in FIGS. 1–2 is an EEPROM cell 1 of the FLOTOX type with two levels of polysilicon, which cell is integrated in a conductive substrate 2 of the P type.

The description which follows will make reference to a preferred embodiment implemented with devices of the N type. For devices of the P type, the types of conductivities mentioned herein below should be reversed.

The memory cell 1 comprises a floating gate MOS transistor 3 and an associated selection transistor 10 for selecting a cell to be programmed from a group of cells in a memory matrix.

The floating gate transistor 3 has a source region 4 and a drain region 5.

Between the source region 4 and the drain region 5, a gate region 6 projects from the substrate 2.

The gate region 6 is isolated from the surface of the substrate 2 by a layer 7 of gate oxide which has a thinner portion referred to as the tunnel oxide 8.

The gate region 6 comprises conventionally a floating gate region 6a formed from a first layer 13 of polysilicon, and a control gate region 6b formed from a second polysilicon layer 14.

An intermediate dielectric layer 15 provides insulation between the two gate regions 6a, 6b.

The drain region 5 is formed, for example, by an implant of the N type.

Advantageously, the drain region 5 is formed using an LDD implanting technique.

The drain region 5 is formed, for example, by an N-type implant in the substrate 2. Formed at this drain region 5 is a more heavily doped region 9 of the N+ type which extends beneath the tunnel region 8.

The source region 4 of the cell 1 is formed by implanting the substrate 2 with dopant of the N+ type and is formed concurrently with the process step for forming the heavily doped regions 9.

The selection transistor 10 has a source region 11 which is coincident with the drain region 5 of the floating gate transistor 3, and has a drain region 12 formed in the substrate 2.

The drain region 12 is formed, for example, by an N-type implant.

Advantageously, the drain region 12 is formed using an LDD implanting technique.

A gate region 16, isolated from the substrate 2 by the oxide layer 7, extends between the source 11 and drain 12 regions.

The gate region 16 includes conventionally two overlapping polysilicon regions 16a, 16b formed in first and second layers 13, 14 of polysilicon (FIGS. 5–7), respectively, with the interposition of the intermediate dielectric layer 15; the two regions 16a, 16b are then short-circuited outside the cell.

Referring to FIGS. 3 to 10, a method for forming said cell 1 includes carrying out a first selective implantation of the N+ type to form a source region 4 of the floating gate MOS transistor 3 and a heavily doped region 9 of the N+ type.

A first oxide layer 7 of a first thickness, for forming the gate oxides of the cell 1, and a second oxide layer 8 of a second thickness smaller than that of the first layer 7, for forming the tunnel oxide of the cell 1 (FIG. 4), are then formed selectively.

A first polysilicon layer 13, as shown in FIG. 5, a third intermediate oxide layer 15, and a second polysilicon layer 14 (FIG. 6) are then deposited.

A self-aligned etching step is then carried out by a conventional photolithographic process wherein a photolithographic mask 17 is used to define the gates 6 and 16 (FIG. 7).

A second implantation, of the N type, is effected to form the drain region of the floating gate transistor 3 and of the selection transistor 10 (FIG. 8).

Spacers 18, and the drain contacts of the selection transistor 10 are then formed conventionally (FIGS. 9, 10).

Figure 11:
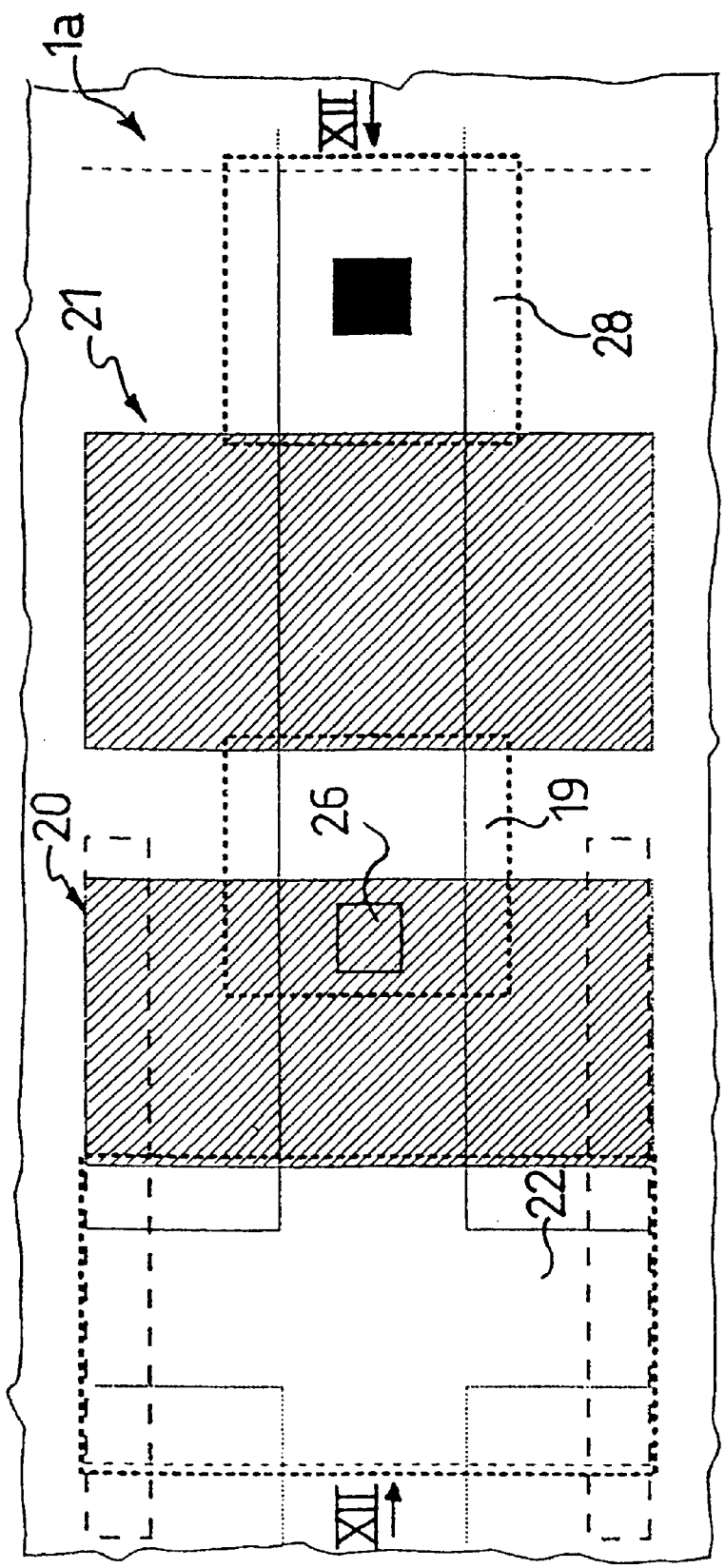
FIG. 11 is a plan view of an EEPROM cell according to a second embodiment of the invention.
Figure 12:
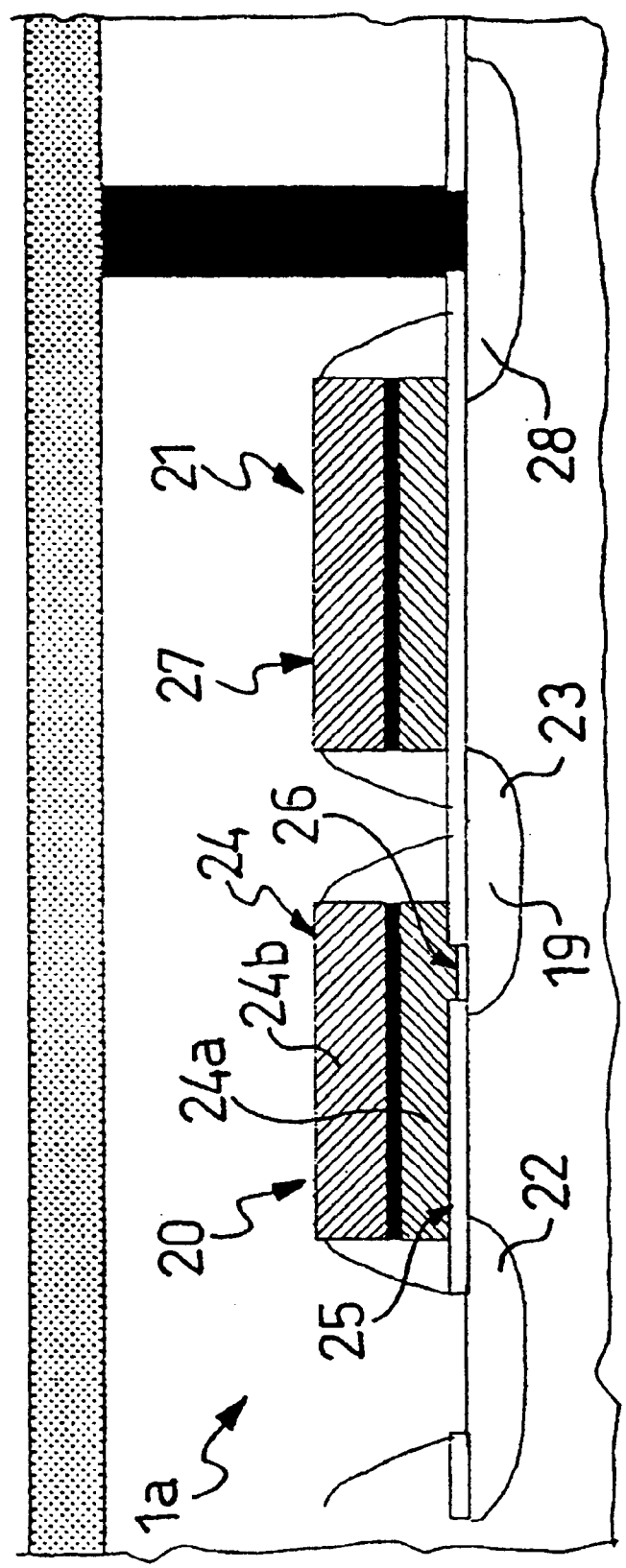
FIG. 12 is a sectional view, taken along line XII—XII, of the cell shown in FIG. 11.

A memory cell 1a according to a second embodiment of the invention is shown in FIGS. 11 and 12.

The memory cell 1a comprises a floating gate MOS transistor 20 and an associated selection transistor 21.

The floating gate transistor 20 has a source region 22, a drain region 23, and a gate region 24 including a floating gate region 24a and a control gate region 24b. The gate region 24a, formed from a first polysilicon layer, is isolated from the surface of the substrate 2 by a layer 25 of gate oxide which has a thinner portion referred to as the tunnel oxide 26.

The control gate region 24b, formed from a second polysilicon layer, is coupled capacitively to the floating gate region 24a through an intermediate dielectric layer.

The selection transistor 21 includes a drain region 28 and a gate region 27.

The source region 23 of the selection transistor 21 is in common with the drain region 19 of the floating gate transistor 20.

This region 23 extends from the portion of the substrate 2 underlying the tunnel oxide 26 to the portion of the substrate 2 underlying the gate region 27 of the transistor 21.

The region 23 is formed by an implant of the N+ type. In particular, the region is formed during the same process step as is devoted to forming the source region 22 of the floating gate transistor 20.

Advantageously in this embodiment, the drain region 28 of the selection transistor 21 is formed by the same N+ implant as the source region 22.

Figure 13:
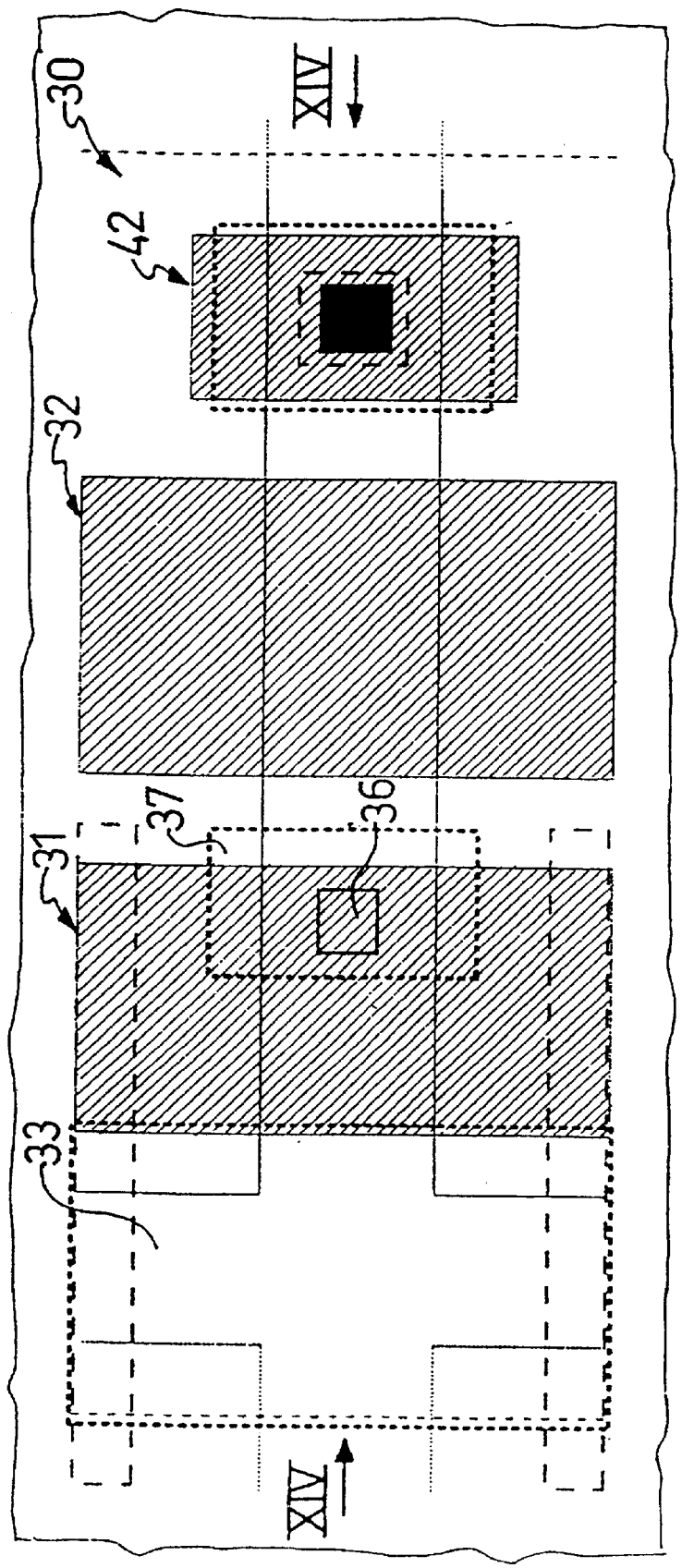
FIG. 13 is a plan view of an EEPROM cell according to a third embodiment of this invention.
Figure 14:
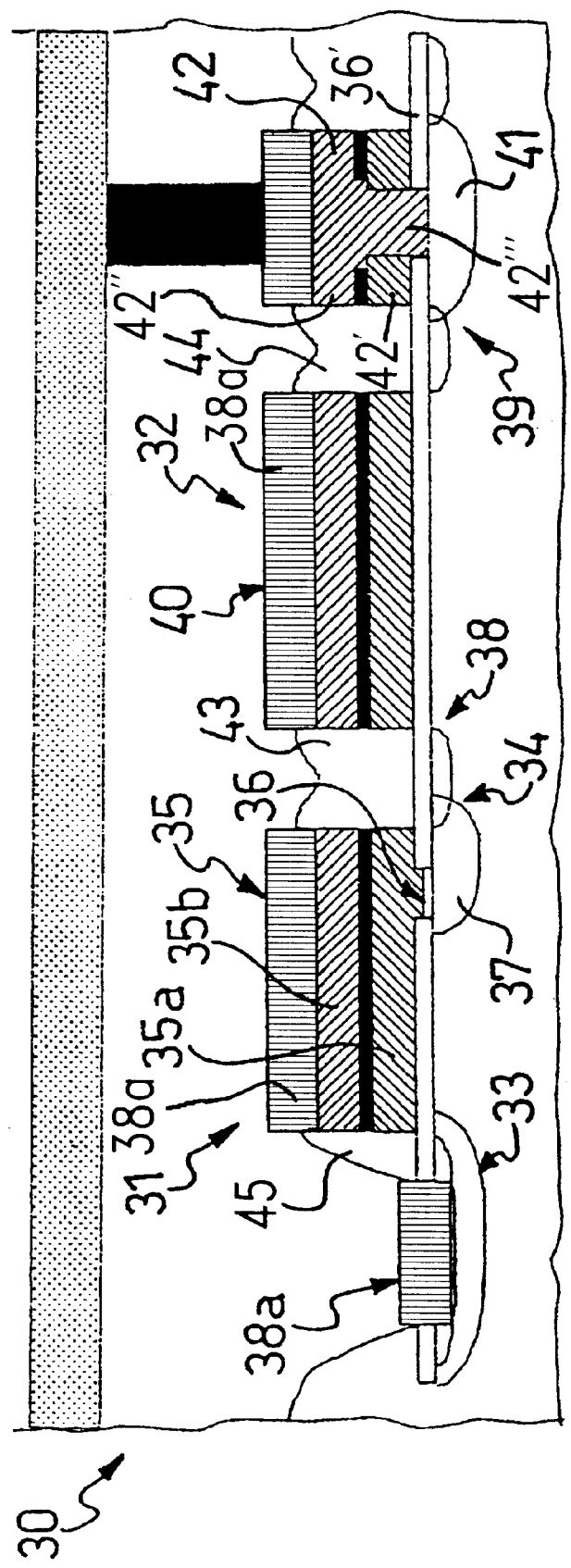
FIG. 14 is a sectional view, taken along line XIV—-XIV, of the cell shown in FIG. 13.

FIGS. 13, 14 show a memory cell 30 according to a third embodiment of the invention.

A memory cell 30 comprises conventionally a floating gate transistor 31, and an associated selection transistor 32.

The floating gate transistor 31 has source 33 and drain 34 regions, and a gate region 35 which comprises a floating gate region 25a and a control gate region 35b. The gate region 35a is formed from a first polysilicon layer, and is isolated from the substrate 2 by an oxide layer 36' which has a thinner portion or tunnel region 36.

The control gate region 35b is formed from a second polysilicon layer and coupled capacitively to the floating gate region 35a through an intermediate dielectric layer.

Advantageously, the gate region 35 comprises a portion of a silicide layer 38a.

The drain region 34 is formed by an implant of the N– type (lightly doped drain) in the substrate 2. Formed at this drain region 34 is a heavily doped region 37 of the N+ type which extends to beneath the tunnel region 36.

The source region 33 of the cell 31 is formed by an N+ dopant implant in the substrate 2. On the source region 33 a portion of the silicide layer 38a is formed.

The source region 33 and region 37 are formed by the same implanting step.

The selection transistor 32 has a source region 38 of the N– type which is coincident with the drain region 34 of the floating gate transistor 31, a drain region 39 formed in the P-type substrate 2, and a gate region 40.

Advantageously, the gate region 40 includes another portion of the silicide layer 38a.

The region 39 also includes a contact region 41, formed by implantation of an N+ dopant. A contact head 42 is placed on this contact region.

This head 42 includes a first portion 42' formed from a first polysilicon layer and isolated from the region 41 by the oxide layer 36', and a second portion 42" formed from a second polysilicon layer. A projection 42'" of the second portion 42" is in direct contact with the region 41. Said first portion 42' encircles the projection 42'" of said second portion 42". An oxide layer may be provided between the first and second portions. The second portion 42" is overlaid by a portion of the silicide layer 38a.

Screening elements 43, 44 of a dielectric material are formed between the gate regions 35 and 40, and between the gate region 40 and the contact head 42.

A spacer 45, also made of a dielectric material, is formed on the side of the gate region 35 facing toward the source region 33.

This memory cell 30 is specially advantageous where the EEPROM cell fabrication process provides for the formation of silicide layers.

By forming the source region of the floating gate transistor as an N+ implant, this region and the gate regions of the cell can be silicidized without incurring a short circuit of the silicide layer provided on the source region to the substrate, as may instead occur where the source region is obtained by an LDD or N-type implantation according to the prior art, and this without additional fabrication process steps.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for forming EEPROM cells comprising a floating gate MOS transistor having a source region, a drain region, a gate region projecting from a substrate and being isolated from the substrate by an oxide layer which includes a thinner tunnel portion, and a heavily doped region formed under said tunnel portion and extending to beneath the drain region, the heavily doped region including a tunnel region directly below the tunnel portion, the method comprising:

forming both said source region and said heavily doped region in a single dopant implantation step that is the only dopant implantation of the tunnel region;

forming the gate region over the tunnel region and the tunnel portion of the oxide layer; and implanting the drain region with a lighter doping than that of the source and heavily doped regions after implanting the source and heavily doped regions.

2. A method for forming EEPROM cells comprising a floating gate MOS transistor having a source region, a drain region, a gate region projecting from a substrate and being isolated from the substrate by an oxide layer including a thinner tunnel portion, and a heavily doped region formed directly under said tunnel portion, the method comprising:

forming simultaneously said source region and said heavily doped region using a single dopant implantation step that is the only dopant implantation directly under the tunnel portion;

forming the gate region after forming the source and heavily doped regions; and implanting the drain region with a lighter doping than that of the source and heavily doped regions after implanting the source and heavily doped regions.

3. The method of claim 2 wherein the tunnel portion is formed after forming the source and heavily doped regions.

4. The method of claim 2 wherein the heavily doped region is formed to extend beneath the drain region of the floating gate MOS transistor.

5. The method of claim 2 wherein a gate region of a selection transistor is formed at a position sufficiently adjacent to the heavily doped region so that the heavily doped region acts as a source region for the selection transistor in addition to the drain region for the floating gate MOS transistor.

6. The method of claim 2, further comprising forming a silicide layer over the source region of the floating gate MOS transistor.

7. The method of claim 5 wherein the implantation step also forms a drain region of the selection transistor on an opposite side of the gate region of the selection transistor from the heavily doped region.

8. The method of claim 2 wherein a gate region of a selection transistor is formed at a position sufficiently adjacent to the heavily doped region so that the drain region acts as a source region for the selection transistor and the step of implanting the drain region also implants a drain region of the selection transistor.

9. The method of claim 1 wherein the tunnel portion is formed after forming the source and heavily doped regions.

10. The method of claim 1 wherein a gate region of a selection transistor is formed at a position sufficiently adjacent to the heavily doped region so that the heavily doped region acts as a source region for the selection transistor in addition to the drain region for the floating gate MOS transistor.

11. The method of claim 10 wherein the implantation step also forms a drain region of the selection transistor on an opposite side of the gate region of the selection transistor from the heavily doped region.

12. The method of claim 1, further comprising forming a silicide layer over the source region of the floating gate MOS transistor.

13. The method of claim 1 wherein a gate region of a selection transistor is formed at a position sufficiently adjacent to the heavily doped region so that the drain region acts as a source region for the selection transistor and the step of implanting the drain region also implants a drain region of the selection transistor.

* * * * *